(12) United States Patent
Lie et al.

(10) Patent No.: US 11,079,337 B1
(45) Date of Patent: Aug. 3, 2021

(54) SECURE WAFER INSPECTION AND IDENTIFICATION

(71) Applicant: International Business Machines Corporation, Armonk, NY (US)

(72) Inventors: Fee Li Lie, Albany, NY (US); Effendi Leobandung, Stormville, NY (US); Richard C. Johnson, Selkirk, NY (US); Scott Halle, Slingerlands, NY (US); Robin Hsin Kuo Chao, Portland, OR (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/821,107

(22) Filed: Mar. 17, 2020

(51) Int. Cl.
*G03F 7/20* (2006.01)
*G01N 21/95* (2006.01)
(Continued)

(52) U.S. Cl.
CPC ....... *G01N 21/9501* (2013.01); *G01N 21/956* (2013.01); *G01R 31/318511* (2013.01); *H01L 22/24* (2013.01)

(58) Field of Classification Search
CPC ............ G03F 7/70633; G03F 7/70625; G03F 7/70683; G03F 9/7049; G03F 9/7084; G03F 9/7088; G03F 7/70616; G03F 7/7065; G03F 7/707; G03F 7/0002; G03F 7/70708; G03F 7/70783; G03F 7/70866; G01N 21/956; G01N 2021/213; G01N 21/9501; G01N 21/211; H01L 22/24; H01L 22/20; H01L 22/12; H01L 21/027; H01L 23/544; H01L 21/68757; H01L 21/67282; H01L 21/67288; H01L 21/68742; H01L 21/6875; H01L 21/6838; H01L 21/67259; G01R 31/318511; G06K 9/0002; G06K 9/00053
See application file for complete search history.

(56) References Cited

U.S. PATENT DOCUMENTS 5,867,276 A   2/1999 McNeil et al.
5,974,150 A   10/1999 Kaish et al.
(Continued)

OTHER PUBLICATIONS

Aswin Sreedhar et al., "Physically unclonable functions for embeded security based on lithographic variation," Design, Automation & Test in Europe, 2011, 6 pp.
(Continued)

*Primary Examiner* — Mesfin T Asfaw
(74) *Attorney, Agent, or Firm* — Jeffrey S LaBaw; Michael J. Chang, LLC

(57) ABSTRACT

Techniques for secure and tamper-resistant wafer identification using a unique wafer fingerprint are provided. In one aspect, a method for wafer authentication includes: placing, at each level of fabrication of chips on the wafer, reference structures across the chips; inspecting the wafer at each level of the fabrication; and performing at least one of overlay and scatterometry measurements of the reference structures to use as a unique fingerprint for authenticating the wafer that has been inspected. A method for authentication throughout a process flow for fabrication of chips on a wafer is also provided, as is a wafer having chips and reference structures placed across the chips at each level of the chips to provide a unique fingerprint for authenticating the wafer.

20 Claims, 6 Drawing Sheets

(51) Int. Cl.
   *H01L 21/66*     (2006.01)
   *G01R 31/3185*   (2006.01)
   *G01N 21/956*    (2006.01)

(56) References Cited

U.S. PATENT DOCUMENTS

| | | | |
|---|---|---|---|
| 7,715,007 | B2 | 5/2010 | Brill et al. |
| 7,757,083 | B2 | 7/2010 | Devadas et al. |
| 8,850,281 | B2 | 9/2014 | Potkonjak |
| 8,877,525 | B1 | 11/2014 | Leobandung et al. |
| 9,032,476 | B2 | 5/2015 | Potkonjak |
| 9,053,596 | B2 | 6/2015 | Blair |
| 9,292,990 | B2 | 3/2016 | Blair |
| 10,127,447 | B2 | 11/2018 | Duerksen et al. |
| 2016/0196472 | A1* | 7/2016 | Duerksen ............. G06K 9/4604 382/145 |
| 2020/0026201 | A1* | 1/2020 | Hauptmann .......... G03F 9/7003 |

OTHER PUBLICATIONS

Sullivan et al., "Overlay Metrology: The systematic, the random and the ugly," AIP Conference Proceedings 449, 502-512 (Mar. 1998).

* cited by examiner

US 11,079,337 B1

SECURE WAFER INSPECTION AND IDENTIFICATION

FIELD OF THE INVENTION

The present invention relates to wafer inspection and identification techniques, and more particularly, to secure and tamper-resistant identification of wafer and chips using unique wafer fingerprint resulting from natural process variation on the wafer during semiconductor device design and fabrication, in conjunction with wafer inspection to detect tampering.

BACKGROUND OF THE INVENTION

There are many points throughout the semiconductor device design and fabrication process flows in which aberrant feature can be introduced into the chip, for example, as a result of error, equipment malfunction, or even maliciously. For example, a given device design can become compromised by means of introducing different masks and/or different wafers with slight changes in the design at one or more point during the fabrication process in an untrusted fabrication model. Thus, verification of the device design is an important step during fabrication.

However, verification of device designs typically happens later on in the process, sometimes even at the end of fabrication flow. Further, a foundry typically provides sampling of the output, rather than a comprehensive design verification. Unfortunately, these aberrant features could occur in a way that their detection at final test or by output sampling is very difficult, if at all possible.

Additionally, to date there is no effective way to verify that the inline metrology data provided by the manufacturer comes from the same wafer. Thus, even if the customer has a way to inspect a wafer during different levels of fabrication, once the wafer re-enters fab, there currently exists no method to verify wafer identification (ID) other than the conventional ID often employed on the back of the wafer. However, such conventional IDs can be incorrect or easily tampered with.

Thus, techniques for improved secure and tamper-resistant identification of wafers would be desirable.

SUMMARY OF THE INVENTION

The present invention provides techniques for secure and tamper-resistant identification of wafer and chips using unique wafer fingerprint resulting from natural process variation on the wafer during semiconductor device design and fabrication. In one aspect of the invention, a method for wafer authentication is provided. The method includes: placing, at each level of fabrication of chips on the wafer, reference structures across the chips; inspecting the wafer at each level of the fabrication; and performing at least one of overlay and scatterometry measurements of the reference structures to use as a unique fingerprint for authenticating the wafer that has been inspected.

In another aspect of the invention, a method for authentication throughout a process flow for fabrication of chips on a wafer is provided. The method includes: processing a level N of the wafer during which reference structures are placed across the chips at the level N of the wafer; performing first overlay and scatterometry measurements of the reference structures at the level N of the wafer; inspecting the level N of the wafer; processing a level N+1 of the wafer during which the reference structures are placed across the chips at the level N+1 of the wafer; performing second overlay and scatterometry measurements at the level N+1 of the wafer of the reference structures placed at the level N of the wafer; and matching the first overlay and scatterometry measurements of the reference structures at the level N of the wafer to the second overlay and scatterometry measurements of the reference structures at the level N of the wafer for authentication of the wafer that has been inspected.

In yet another aspect of the invention, a wafer is provided. The wafer includes: chips fabricated on the wafer including reference structures placed across the chips at each level of the chips, wherein the reference structures provide a unique fingerprint for authenticating the wafer when at least one of overlay and scatterometry measurements of the reference structures are performed.

A more complete understanding of the present invention, as well as further features and advantages of the present invention, will be obtained by reference to the following detailed description and drawings.

DETAILED DESCRIPTION OF PREFERRED EMBODIMENTS

Figure 1:
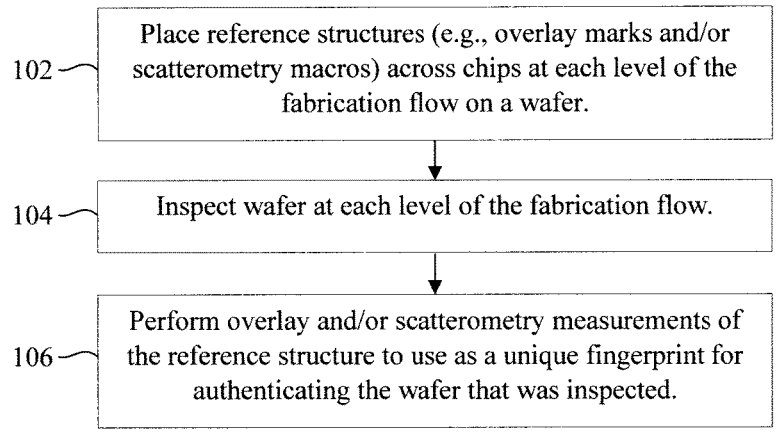
FIG. 1 is a diagram illustrating an exemplary methodology for wafer authentication according to an embodiment of the present invention.

Provided herein are techniques for secure and tamper-resistant identification of wafer and chips using unique wafer fingerprints resulting from natural process variation on the wafer during semiconductor device design and fabrication. Advantageously, the present techniques can be used to efficiently and effectively detect whether a circuit design has been modified due, for example, to error, or even malicious intent.

Generally, if modifications to a circuit design are made, the overall shape of the circuit on the wafer will change. Thus, such modifications can be detected by monitoring the shapes being formed on the wafer during fabrication to determine whether certain shapes on the wafer have been altered and/or whether shapes have been added to the wafer.

By way of example only, this detection process can involve taking images of the wafer during each level of the fabrication process. These images can then be compared to the design of each level of the circuit to determine whether there are any discrepancies in the shapes of the design versus those that appear on the wafer.

However, there needs to be a system of accountability that the wafer that was inspected is in fact the same wafer that is provided to the customer. For instance, a system needs to be in place to ensure that the wafer was not swapped out for another wafer after inspection. Thus, in accordance with the present techniques, a unique fingerprinting of the wafer is used to authenticate the wafer. In other words, this fingerprinting of the wafer validates that the wafer being inspected and verified against the design data is in fact the same wafer that was inspected. Advantageously, the present fingerprinting techniques can provide a unique means for authentication at each level of inspection.

As will be described in detail below, this unique fingerprinting of the wafer can be detected in metrology using overlay measurements and/or scatterometry. In general, an overlay metrology measures of an amount of displacement from one level of the semiconductor design to another. As is generally known in the art, semiconductor device fabrication oftentimes involves formation of the device design in multiple levels, where the fabrication process proceeds level by level.

For instance, for illustrative purposes only, the gate or gates of a complementary metal oxide semiconductor (CMOS) field-effect transistor (FET) device may be fabricated at a given level N of the device design. Once fabricated, the gate(s) can be covered with a dielectric material (generally referred to herein as an interlayer dielectric or ILD), and N+1, N+2, etc. metal levels (e.g., metal lines, metal vias, etc.) can be built over the gates. An overlay metrology measures the overlay between the gate(s) at level N and the overlying metal levels N+1, N+2, etc. and/or from one metal level N+1, N+2, etc. to another. Overlay can be measured using standard optical or electron-beam (e-beam) methods. By way of example only, overlay can be defined as a planar distance from a center of a feature (e.g., metal line/via) at one level to the center of another feature (e.g., a gate) at the underlying level. See, for example, Sullivan et al., "Overlay Metrology: The systematic, the random and the ugly," AIP Conference Proceedings 449, 502-512 (March 1998) (hereinafter "Sullivan"), the contents of which are incorporated by reference as if fully set forth herein. As provided in Sullivan, overlay uncertainty involves a complex mix of tool, target and process interactions. These complex factors result in natural process variation on the wafer throughout a fabrication flow.

Scatterometry can be used to measure the size of a feature or features in the device design. By way of example only, the size of a feature may be quantified based on the critical dimension of the feature. The term "critical dimension," as used herein, refers to at least one dimension of a feature that impacts the electrical properties of the device, such as the length and/or width of the channel of a CMOS FET. For instance, using the above example as a non-limiting illustration, scatterometry can be used to measure the critical dimensions of the gate(s) at level N, the critical dimensions of the features (e.g., metal lines and/or metal vias) at each of metal level N+1, N+2, etc. Like overlay, the resulting size of each feature is the result of a complex mix of factors, such as tool, target and process interactions. These complex factors result in natural process variation on the wafer throughout a fabrication flow. As will be described in detail below, according to an exemplary embodiment, scatterometry measurements made at sample reference points (e.g., of sample scatterometry macros across the wafer kerf or chip area) will be used as a unique fingerprint to authenticate the wafer at each level of inspection. Scatterometry measurement data can be obtained using a scatterometer. It is notable that, while scatterometry structures are proposed herein as a preferred embodiment, other possible structure can also be used and measured to determine the critical dimension.

Leveraging the natural process variation on the wafer described above, overlay and/or scatterometry structures will be placed across the chips at each level of a fabrication flow to be used as a unique fingerprint for authenticating the wafer at each level of the fabrication flow that is virtually impossible to replicate. See, for example, methodology 100 of FIG. 1 which provides an overview of the present process for wafer authentication.

In step 102, reference structures are placed across the chips. Preferably, placement of the reference structures occurs at each level of fabrication of the chips on the wafer or, optionally, at critical levels of the process. As highlighted above, overlay and/or scatterometry measurements will be leveraged for producing unique fingerprinting throughout the fabrication flow. Thus, according to an exemplary embodiment, these reference structures include overlay marks and/or scatterometry macros. As will be described in detail below, the reference structures can be placed across the chips on a kerf and/or chip area of the wafer.

In step 104, the wafer is inspected. According to an exemplary embodiment, this inspection is performed at each level of the fabrication flow. As highlighted above, wafer inspection can involve matching the shapes on the wafer to the design data. The inspection process can leverage a defect inspection tool and process using optical or e-beam, as is widely used in semiconductor manufacturing.

In step 106, overlay and/or scatterometry measurements of the reference structures are performed. These measurements are used as a unique fingerprint for authenticating the wafer that was inspected (in step 104). Preferably, the overlay and/or scatterometry measurements are performed post etching of the wafer at each level of the fabrication flow. That way, the placement of the reference structures at the current level of fabrication is fixed and cannot be reworked.

Overlay and scatterometry measurements are now collected for the various reference structures across the chips and, as will be described in detail below, different chip-selection patterns can be determined for selecting the overlay and scatterometry measurements to use for authenticating the wafer. For instance, some exemplary chip-selection patterns include, but are not limited to, a quadrant pattern, a checkboard pattern, and a radial pattern. Each of these selection patterns will be described in detail below. In general, however, chip-selection patterns both with and without overlap of the grouping are contemplated herein.

Figure 2:
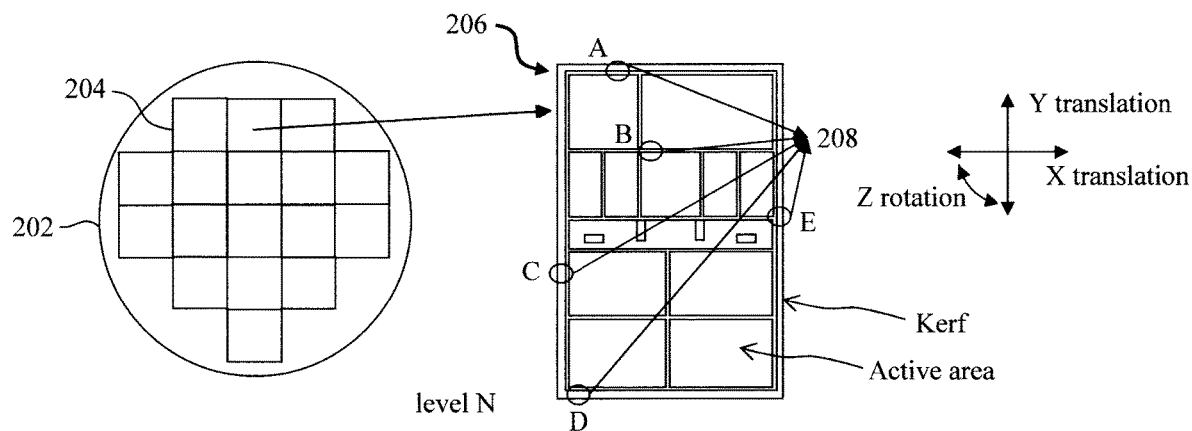
FIG. 2 is a diagram illustrating placement of reference structures across chips at each level (e.g., at a level N) of a fabrication flow for unique fingerprinting and authentication via overlay and scatterometry measurement according to an embodiment of the present invention.

Given the above overview of the present techniques, FIG. 2 is a diagram illustrating placement of the present reference structures (e.g., overlay marks and/or scatterometry macros) across chips at each level of the fabrication flow for unique fingerprinting and authentication via overlay and scatterometry measurement. For instance, as depicted in FIG. 2 a semiconductor device fabrication flow involves the fabrication of at least one chip 204 on a semiconductor wafer 202. In the context of the present techniques, the term "chip" refers generally to a piece of semiconductor containing an integrated circuit. The term "die" may also be used interchangeably herein with the term "chip."

As shown in expanded view 206 of one of the chips 204, multiple reference structures 208 (e.g., overlay marks and/or scatterometry macros) are placed across the kerf (see, e.g., locations A, C, D and E) and/or chip area (see, e.g., location B) of the wafer 202. As is generally known in the art, integrated circuits are formed on a wafer such as semiconductor wafer 202. The wafer is then cut (diced) into individual chips or die such as chip 204. The term "kerf," as used herein, refers to the regions of the design where the cutting/dicing will take place. The "chip area" is the area in between the kerf regions in which the integrated circuits are formed. See FIG. 2. It is notable that the number and placement of the reference structures 208 shown in FIG. 2 is provided merely as a non-limiting example meant to illustrate the present techniques. Namely, more or fewer reference structures 208 than shown may be placed anywhere across the kerf and/or chip area of wafer 202.

It is notable that the reference structures 208 will remain uncovered throughout processing of the various levels of the wafer. For instance, the placement of the reference structures 208 can be varied from one level to the next to avoid overlap, i.e., the reference structures 208 are preferably offset slightly from each other so that they do not cover each other. Doing so enables overlay/scatterometry measurements of the reference structures 208 placed across the chips at one level to be made at the next level. Thus, reference structures 208 can serve as the basis for a secure fingerprinting tool that is used to authenticate each level of the device design by comparing the overlay and/or scatterometry measurements made at multiple levels. For instance, overlay/scatterometry measurements of the reference structures placed across the chips at level N can be made after level N fabrication, and again after level N+1 fabrication. The wafer is then authenticated if, and only if, the overlay/scatterometry measurements made at these two different points in the fabrication flow are the same or can be correlated. This ensures that it is the same wafer being processed both at level N and at level N+1. It is noted that the overlay/scatterometry measurements invariably contain some level of error, which can be compensated for with standard error correction and data analytics. This authentication process can be repeated for as many N+X levels as necessary. To make sure that the reference structures 208 are not covered, according to an exemplary embodiment exclude shapes are placed in the design to ensure that the sample reference points 208 (e.g., the sample overlay marks and/or sample scatterometry macro structures) are not overlaid by other design patterns at subsequent levels.

Figure 2A:
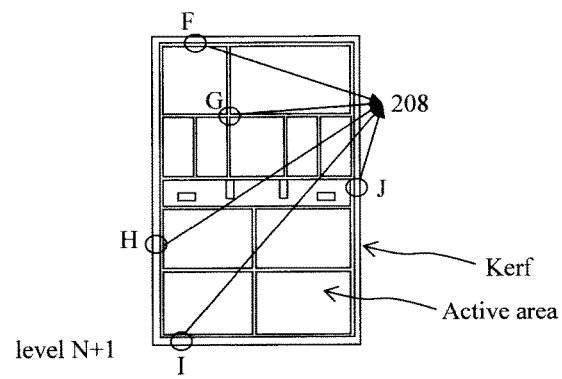
FIG. 2A is a diagram illustrating placement of reference structures across chips at a level N+1 of the fabrication flow according to an embodiment of the present invention.

FIG. 2 depicts the placement of the reference structures 208 across chips 204 at a given level N. FIG. 2A is a diagram illustrating the placement of reference structures 208 across chips 204 at the next level N+1. As shown in FIG. 2A, reference structures 208 (e.g., overlay marks and/or scatterometry macros) are placed across the kerf (see, e.g., locations F, H, I and J) and/or chip area (see, e.g., location G) of the wafer 202. This process for placement of the reference structures 208 across chips 204 can be repeated for each of the N+X levels of the design. Thus, each level N, N+1, N+2, etc. of the design has its own overlay marks and/or scatterometry macros. As highlighted above, the placement of the reference structures 208 can be varied from one level to the next to avoid overlap, i.e., the reference structures 208 at level N+1 are preferably offset slightly from the reference structures 208 at level N, and so on such that they do not cover each other.

As provided above, the reference structures 208 can include one or more overlay marks. By way of example only, overlay marks can be formed using standard lithography and etching techniques such as by etching the mark (for example a '+' shaped mark) into the kerf and/or active area of the wafer at each level of the device design. As provided above, a complex mix of tool, target and process interactions results in a natural variation in the placement of these overlay marks across the chips at each level resulting in a unique fingerprint that is virtually impossible to replicate.

According to an exemplary embodiment, the overlay measurements include a measurement of the overlay error for the overlay marks placed across the chips a given level (e.g., level N+1) vis-à-vis the overlay marks placed across the chips at the underlying level (e.g., level N). For instance, the overlay error can be quantified based on parameters such as the translational X, translational Y, and rotational Z shift of the N and N+1 level overlay marks. See, e.g., FIG. 2 (described above).

As provided above, the reference structures 208 can also include one or more scatterometry macros. Generally, the scatterometry macros can include any shape or combination of shapes patterned into the kerf and/or active area of the wafer using standard lithography and etching techniques.

According to an exemplary embodiment, the scatterometry measurements include collecting scatterometry spectra of the scatterometry macros placed across the chips at each level. The scatterometry spectra will measure the critical dimension (i.e., size) of each of the scatterometry macros. However, as provided above, a complex mix of tool, target and process interactions results in a natural variation in the sizes of the scatterometry macros formed across the chips at each level, resulting in a unique fingerprint that is virtually impossible to replicate.

The fingerprinting can be done at the chip level and/or at the wafer level. For chip level fingerprinting, the fingerprint of each chip will use the measurement data from that chip. For wafer level fingerprinting, a combination of the measurement data from several chips is used. Preferably, the fingerprint for wafer 202 includes the overlay and/or scatterometry measurements of the reference structures 208 across multiple chips 204 on wafer 202, as increasing the number of overlay and/or scatterometry measurements (i.e., #measurements), increases the overall uniqueness of the authentication process. Thus, according to an exemplary embodiment, the overlay and/or scatterometry measurements from multiple chips 204 are used collectively as a fingerprint of wafer 202 that cannot be easily replicated.

To do so, a chip-selection pattern is determined for grouping the chips 204 on wafer 202. Advantageously, grouping the chips 204 on wafer 202 increases the accuracy of the authentication process (see above) while providing a sufficient amount of overlay and/or scatterometry measurement data to produce a unique fingerprint. By way of example only, several multiple chip-selection patterns are contemplated herein. These multiple chip-selection patterns include, but are not limited to, a quadrant pattern (see FIG. 3), a checkboard pattern (see FIG. 4), and a radial pattern (see FIG. 5).

Figure 3:
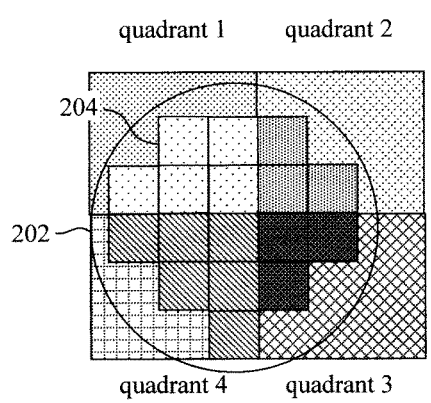
FIG. 3 is a diagram illustrating a quadrant chip-selection pattern according to an embodiment of the present invention.

For instance, referring to FIG. 3 a quadrant chip-selection pattern involves dividing the wafer 202 into four quadrants (i.e., quadrant 1, quadrant 2, quadrant 3 and quadrant 4), and grouping the chips 204 that are present on wafer 202 within each of the quadrants. For instance, as shown in FIG. 3, the five chips 204 that are present within quadrant 1 make up a first grouping, the three chips 204 that are present within quadrant 2 make up a second grouping, the three chips 204 that are present within quadrant 3 make up a third grouping, and the six chips 204 that are present within quadrant 4 make up a fourth grouping. According to an exemplary embodiment, a distribution of the overlay and/or scatterometry measurements from the chips 204 in each grouping (in this case each quadrant) are obtained. The measurement distributions obtained from the groupings are then used as the unique fingerprint for the wafer 202. In this example, the quadrant pattern results in four measurement distributions per wafer (at each level).

Figure 4:
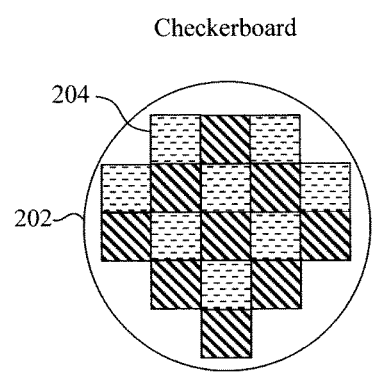
FIG. 4 is a diagram illustrating a checkerboard chip-selection pattern according to an embodiment of the present invention.

Referring to FIG. 4, a checkerboard chip-selection pattern involves dividing the wafer 202 into a checkerboard pattern. With this checkboard pattern, the chips 204 alternate between being present in a first grouping or a second grouping, with every other chip 204 belonging to a different grouping than the adjacent chips 204. Thus, for instance, as shown in FIG. 4, along the top row, from left to right, the chip 204 on the left is present in a first grouping, the next chip 204 over is present in a second grouping, and the chip 204 on the right is present in the first grouping. This pattern repeats itself for each subsequent row moving down the wafer 202, alternating between the chips being included in the first grouping or the second grouping. Thus, according to an exemplary embodiment, a distribution of the overlay and/or scatterometry measurements from the chips 204 in each grouping (in this case the first grouping or the second grouping) are obtained. The measurement distributions obtained from the groupings are then used as the unique fingerprint for the wafer 202. In this example, the checkerboard pattern results in two measurement distributions per wafer (at each level).

Figure 5:
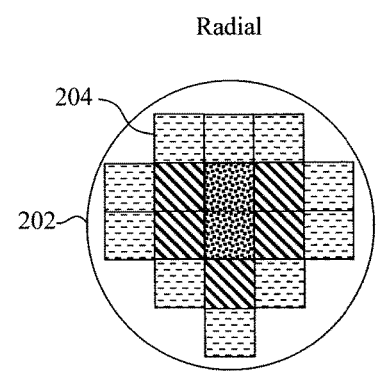
FIG. 5 is a diagram illustrating a radial chip-selection pattern according to an embodiment of the present invention.

Referring to FIG. 5, a radial chip-selection pattern involves grouping chips 204 at the center of wafer 202, and then making grouping of chips 204 radially out from the center. Thus, for instance, as shown in FIG. 5, the two chips (having a dotted pattern) at the center of wafer 202 are a first grouping. Moving out radially from the center/first grouping, the next five chips 204 (having a hatched pattern) are a second grouping. Moving out radially from the second grouping, the next ten chips with a broken line pattern are a third grouping, and so on. Thus, according to an exemplary embodiment, a distribution of the overlay and/or scatterometry measurements from the chips 204 in each grouping (in this case the first grouping at the center of wafer 202, the second grouping radially out from the center, and so on) are obtained. The measurement distributions obtained from the groupings are then used as the unique fingerprint for the wafer 202.

Figure 6:
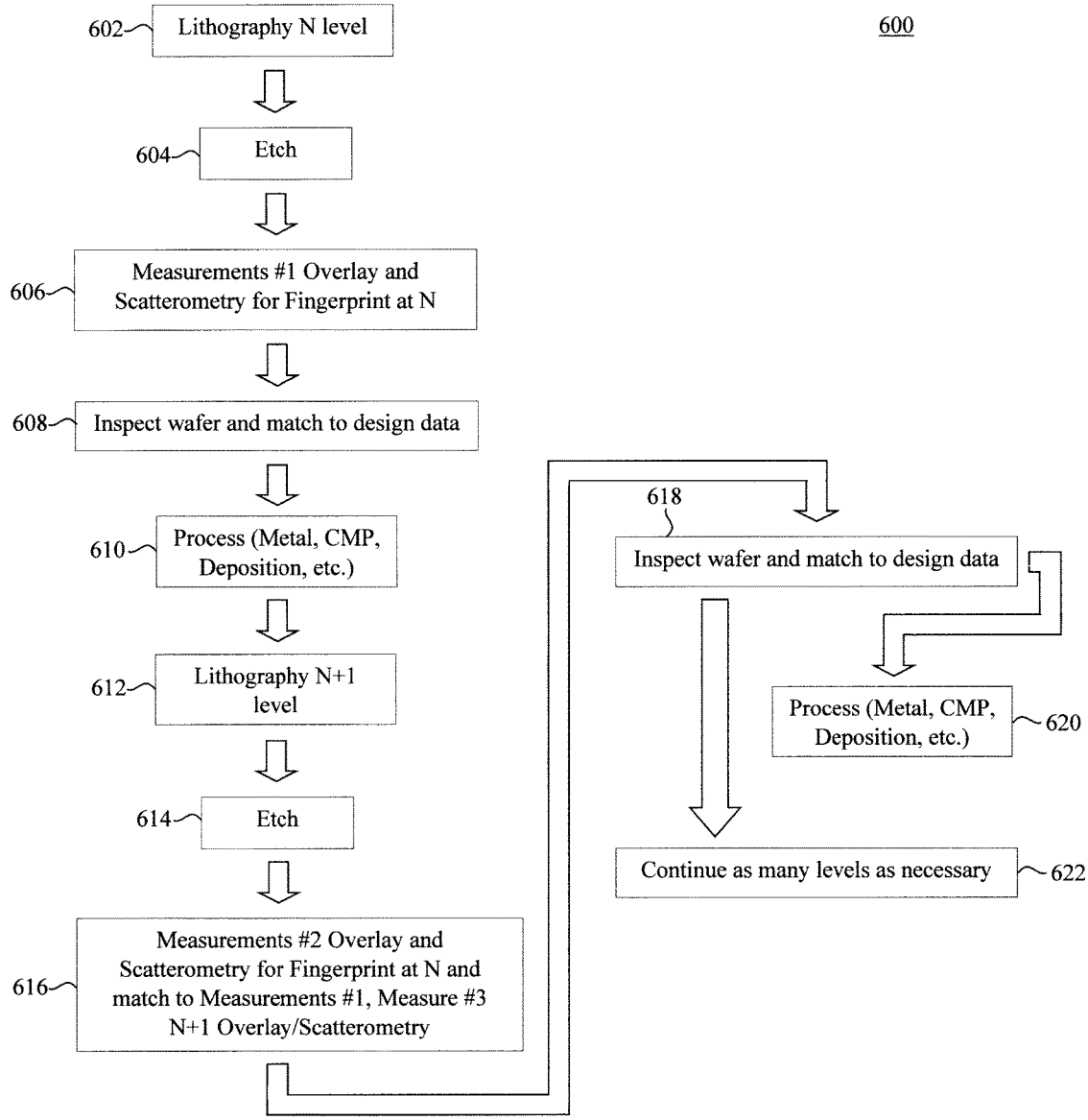
FIG. 6 is a diagram illustrating an exemplary methodology for authentication throughout a process flow for fabrication of chips on a wafer according to an embodiment of the present invention.
Figure 7:
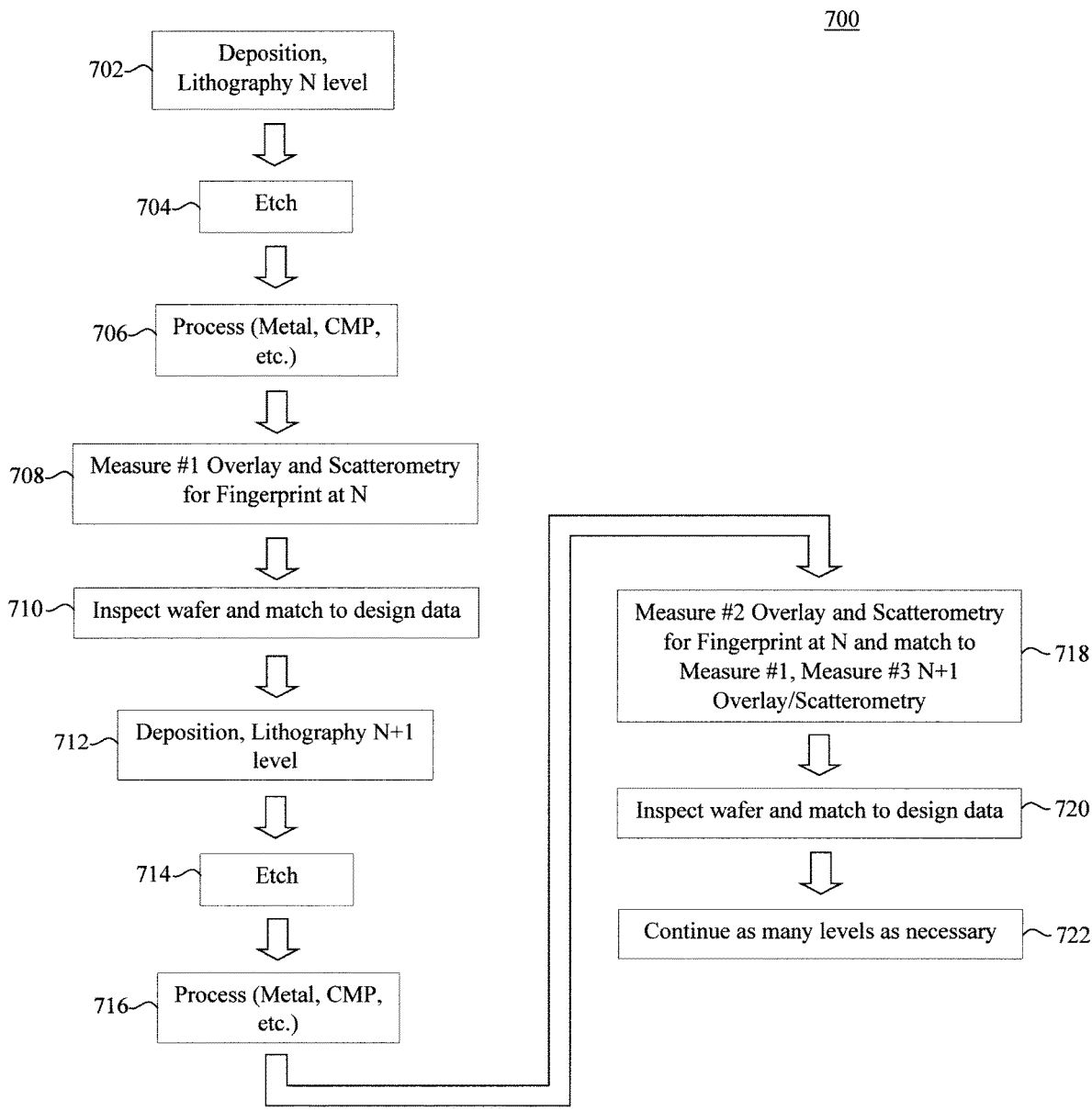
FIG. 7 is a diagram illustrating another exemplary methodology for authentication throughout a process flow for fabrication of chips on a wafer according to an embodiment of the present invention.

Exemplary implementations of the present authentication techniques for secure identification during wafer inspection are now described by way of reference to methodology 600 of FIG. 6, and methodology 700 of FIG. 7. Methodologies 600 and 700 vary depending on when during the processing at a given level (i.e., level N, level N+1, etc.) the authentication and inspection of wafer 202 occurs. However, as provided above, the overlay and/or scatterometry measurements used for authentication are preferably performed post etching of wafer 202 at each level of the fabrication flow. That way, the placement of the reference structures 208 at the current level of fabrication is fixed.

For instance, referring first to methodology 600 of FIG. 6, processing is performed at level N of the wafer 202. In the present example, this processing involves performing lithography (see step 602) and etching (see step 604) at level N of the wafer 202. As is generally known in the art, lithography typically involves the formation of a lithography structure (e.g., a lithography stack having a photoresist/organic planarizing layer (OPL)/anti-reflective coating (ARC)—not shown). An etching process is then used to transfer a pattern from the lithography structure to an underlying substrate (not shown), forming features such as trenches and/or vias (not shown) in the substrate. According to an exemplary embodiment, these lithography and etching process performed in steps 602 and 604, respectively, also serve to place the reference structures 208 across the chips 204 at each level N, N+1, etc.

In step 606, first overlay and/or scatterometry measurements (Measurements #1) of the reference structures 208 at the level N of wafer 202 are made. In step 608, the level N of the wafer 202 is inspected. As provided above, this inspection can involve matching the shapes at level N of the wafer 202 wafer to design data to make sure they are the same.

In step 610, further processing at level N is performed. For instance, the patterned features (resulting from steps 602 and 604) are filled with a material, which is then polished using a process such as chemical-mechanical polishing (CMP). When this process involves the deposition of a metal or metals it is also referred to herein as a 'metallization' process.

The processing is then repeated at the N+1 level of wafer 202. Namely, lithography (see step 612) and etching (see step 614) are performed at level N+1 of the wafer 202. As provided above, these lithography and etching process performed in steps 612 and 614, respectively, also serve to place the reference structures 208 across the chips 204 at level N+1 of wafer 202.

In step 616, second overlay and/or scatterometry measurements (Measurements #2) of the reference structures 208 at the level N of wafer 202 are made. As provided above, the reference structures 208 remain uncovered throughout processing of the various levels of the wafer. Therefore, overlay/scatterometry measurements (Measurements #2) of the reference structures 208 at the level N of wafer 202 can also be made at the next level N+1. To authenticate the wafer 202, the Measurements #2 are then matched to the Measurements #1 from step 606. Note that the Measurements #1 of the reference structures 208 at level N were made during/after processing of level N, whereas the Measurements #2 of the reference structures 208 at level N were made during/after processing of level N+1. As provide above, the Measurements #1/Measurements #2 can represent the overlay/scatterometry measurements taken from select groupings of the chips 204 on wafer 202 based, for example, on a multiple chip-selection pattern such as a quadrant pattern, a checkboard pattern, or a radial pattern.

As described in detail above, the wafer 202 is authenticated if, and only if, the overlay/scatterometry Measurements #2 matches, with a predefined error margin, the overlay/scatterometry Measurements #1. Namely, this comparison of Measurements #2 to Measurements #1 ensures that it is the same wafer being inspected both at level N and at level N+1, respectively. As shown in FIG. 6, this authentication process then can be repeated for as many N+X levels as necessary. Namely, third overlay and/or scatterometry measurements (Measurements #3) of the reference structures 208 at the level N+1 of wafer 202 are then made. In the same manner as above, these Measurements #3 can be used to authenticate wafer 202 after processing of a subsequent level (e.g., level N+2) is performed.

In step 618, the level N+1 of the wafer 202 is inspected. As provided above, this inspection can involve matching the shapes at level N+1 of the wafer 202 wafer to design data to make sure they are the same. In step 620, further processing at level N+1 is performed, e.g., metal fill, CMP, etc. In step 622, the process is continued for as many levels of the device design as is necessary.

Authentication and inspection of the wafer 202 can also occur later in the process, such as following lithography, etching and metal fill. For instance, referring to methodology 700 of FIG. 7, processing is performed at level N of the wafer 202. In the present example, this processing involves performing lithography (see step 702), etching (see step 704) and metallization, e.g., metal fill, CMP, etc. (see step 706) at level N of the wafer 202. Each of these processes was described in detail above. According to an exemplary embodiment, the lithography and etching process performed in steps 702 and 704, respectively, also serve to place the reference structures 208 across the chips 204 at each level N, N+1, etc.

In step 708, first overlay and/or scatterometry measurements (Measurements #1) of the reference structures 208 at the level N of wafer 202 are made. In step 710, the level N of the wafer 202 is inspected. As provided above, this inspection can involve matching the shapes at level N of the wafer 202 to design data to make sure they are the same.

The processing is then repeated at the N+1 level of wafer 202. Namely, lithography (see step 712), etching (see step 714) and metallization, e.g., metal fill, CMP, etc. (see step 716) are performed at level N+1 of the wafer 202. As provided above, these lithography and etching process performed in steps 712 and 714, respectively, also serve to place the reference structures 208 across the chips 204 at level N+1 of wafer 202.

In step 718, second overlay and/or scatterometry measurements (Measurements #2) of the reference structures 208 at the level N of wafer 202 are made. As provided above, the reference structures 208 remain uncovered throughout processing of the various levels of the wafer. Therefore, overlay/scatterometry measurements (Measurements #2) of the reference structures 208 at the level N of wafer 202 can also be made at the next level N+1. To authenticate the wafer 202, the Measurements #2 are then matched to the Measurements #1 from step 606. Note that the Measurements #1 of the reference structures 208 at level N were made during/after processing of level N, whereas the Measurements #2 of the reference structures 208 at level N were made during/after processing of level N+1. As provided above, the Measurements 41/Measurements #2 can represent the overlay/scatterometry measurements taken from select groupings of the chips 204 on wafer 202 based, for example, on a multiple chip-selection pattern such as a quadrant pattern, a checkboard pattern, or a radial pattern.

As described in detail above, the wafer 202 is authenticated if, and only if, the overlay/scatterometry Measurements #2 are the same as the overlay/scatterometry Measurements #1. Namely, this comparison of Measurements #2 to Measurements #1 ensures that it is the same wafer being inspected both at level N and at level N+1, respectively. As shown in FIG. 7, this authentication process then can be repeated for as many N+X levels as necessary. Namely, third overlay and/or scatterometry measurements (Measurements #3) of the reference structures 208 at the level N+1 of wafer 202 are then made. In the same manner as above, these Measurements #3 can be used to authenticate wafer 202 after processing of a subsequent level (e.g., level N+2) is performed.

In step 720, the level N+1 of the wafer 202 is inspected. As provided above, this inspection can involve matching the shapes at level N+1 of the wafer 202 wafer to design data to make sure they are the same. In step 722, the process is continued for as many levels of the device design as is necessary.

At the end of processing and the wafers are authenticated for the last time, each chip 204 on the authenticated wafer 202 can be secretly marked, e.g., using structures that can produce unique ID or fingerprint such as using an in-line electrically measured structure, fuse and/or anti-fuse. Advantageously, this electrical ID or fingerprint acts as a continuation of chip tracking that can be used as provenance along the deployment and usage of the chips 204.

It is notable that the above-described techniques can performed in an automated, or semi-automated manner. For instance, the processing of wafer 202 can be carried out in at least one fabrication tool 802 that is configured to perform one or more of the lithography, etching and metallization processes. See for example system 800 of FIG. 8. By way of example only, fabrication tool 802 can be a semiconductor fabrication cluster tool such as those cluster tools commercially available from Applied Materials, Santa Clara, Calif.

Figure 8:
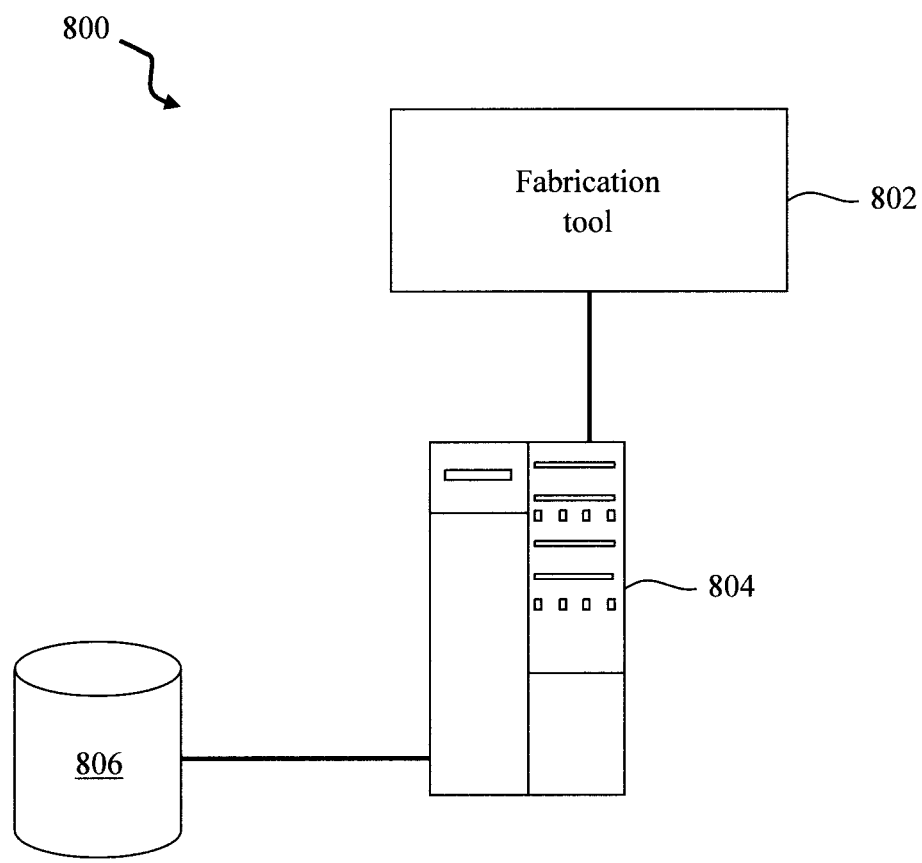
FIG. 8 is a diagram illustrating an exemplary system for wafer authentication according to an embodiment of the present invention.

Further, according to an exemplary embodiment, the fabrication tool 802 has the optical and/or e-beam imaging capabilities for performing the overlay and/or scatterometry measurements during the fabrication flow and/or for imaging the wafer during inspection. As shown in FIG. 8, the fabrication tool 802 is in communication with an apparatus 804 that is configured to retrieve the overlay/scatterometry measurement and optical inspection data from tool 802 and analyze the data, such as matching the overlay/scatterometry Measurements #1, #2, etc. during authentication and/or comparing the fabricated wafer 202 to design data during inspection. An exemplary configuration of apparatus 804 is provided in FIG. 9, described below.

As shown in FIG. 8, apparatus 804 is in communication with at least one database 806. By way of example only, the overlay/scatterometry measurement and optical inspection data from tool 802 retrieved by apparatus 804 from fabrication tool 802 can be stored in database 806 for later retrieval. Optionally, the design data can also be stored in database 806. Thus, for example, when authenticating the wafer 202 apparatus 804 can retrieve the overlay/scatterometry Measurements #1, #2, etc. from database 806 for matching. Likewise, during inspection apparatus 804 can retrieve the design data from database 806 to compare to the images of wafer 202 from the fabrication tool 802.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 9:
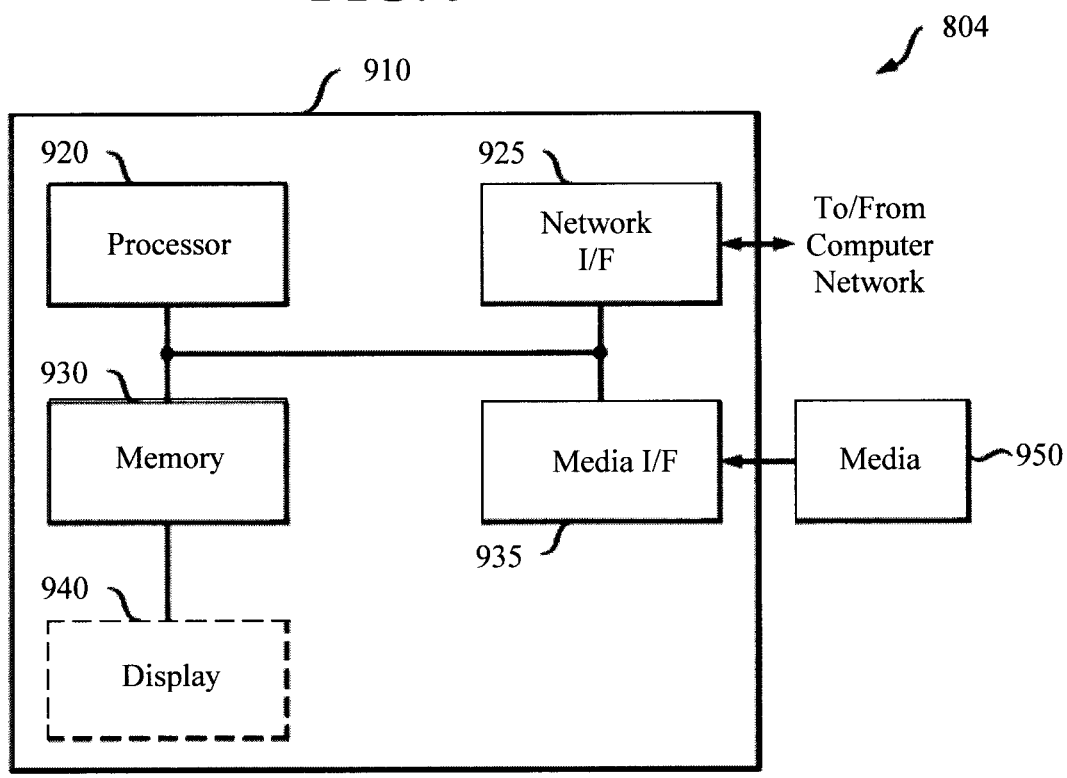
FIG. 9 is a diagram illustrating an exemplary apparatus for performing one or more of the methodologies presented herein according to an embodiment of the present invention.

Turning now to FIG. 9, a block diagram is shown of an exemplary configuration of apparatus 804 of system 800 (see above) for implementing one or more of the methodologies presented herein. By way of example only, apparatus 804 can be configured to implement one or more of the steps of methodology 100 of FIG. 1, one or more of the steps of methodology 600 of FIG. 6, and/or one or more of the steps of methodology 700 of FIG. 7.

Apparatus 804 includes a computer system 910 and removable media 950. Computer system 910 includes a processor device 920, a network interface 925, a memory 930, a media interface 935 and an optional display 940. Network interface 925 allows computer system 910 to connect to a network, while media interface 935 allows computer system 910 to interact with media, such as a hard drive or removable media 950.

Processor device 920 can be configured to implement the methods, steps, and functions disclosed herein. The memory 930 could be distributed or local and the processor device 920 could be distributed or singular. The memory 930 could be implemented as an electrical, magnetic or optical memory, or any combination of these or other types of storage devices. Moreover, the term "memory" should be construed broadly enough to encompass any information able to be read from, or written to, an address in the addressable space accessed by processor device 920. With this definition, information on a network, accessible through network interface 925, is still within memory 930 because the processor device 920 can retrieve the information from the network. It should be noted that each distributed processor that makes up processor device 920 generally contains its own addressable memory space. It should also be noted that some or all of computer system 910 can be incorporated into an application-specific or general-use integrated circuit.

Optional display 940 is any type of display suitable for interacting with a human user of apparatus 804. Generally, display 940 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for wafer authentication, the method comprising the steps of:
    fabricating chips on the wafer, wherein the chips are fabricated in multiple levels on the wafer;
    placing, at each level of fabrication, reference structures across the chips;
    inspecting the wafer at each level of the fabrication; and
    performing at least one of overlay and scatterometry measurements of the reference structures to use as a unique fingerprint for authenticating the wafer that has been inspected.

2. The method of claim 1, wherein the reference structures are selected from the group consisting of: overlay marks, scatterometry macros, and combinations thereof.

3. The method of claim 1, wherein the reference structures are placed on a kerf of the wafer, and wherein a placement of the reference structures is varied from one level of fabrication to another to avoid overlap of the reference structures.

4. The method of claim 1, wherein the reference structures are placed on a chip area of the wafer, and wherein a placement of the reference structures is varied from one level of fabrication to another to avoid overlap of the reference structures.

5. The method of claim 1, wherein the inspecting comprises:
    matching the wafer to design data.

6. The method of claim 1, wherein the overlay and scatterometry measurements are performed post etching of the wafer at each level of the fabrication.

7. The method of claim 1, wherein the overlay and scatterometry measurements from multiple chips are used as the unique fingerprint for authenticating the wafer.

8. The method of claim 7, further comprising the step of:
    determining a chip-selection pattern for grouping the chips on the wafer.

9. The method of claim 8, wherein the chip-selection pattern is selected from the group consisting of: a quadrant pattern, a checkboard pattern, and a radial pattern.

10. The method of claim 1, further comprising the steps of:
    processing a level N of the wafer;
    performing first overlay and scatterometry measurements of the reference structures at the level N of the wafer;
    inspecting the level N of the wafer;
    processing a level N+1 of the wafer;
    performing second overlay and scatterometry measurements of the reference structures at the level N of the wafer; and
    matching the first overlay and scatterometry measurements of the reference structures at the level N of the wafer to the second overlay and scatterometry measurements of the reference structures at the level N of the wafer for authentication.

11. The method of claim 10, further comprising the step of:
    performing third overlay and scatterometry measurements of the reference structures at the level N+1 of the wafer.

12. The method of claim 10, further comprising the steps of:
    performing lithography and etching at the level N of the wafer to process the level N of the wafer; and
    performing lithography and etching at the level N+1 of the wafer to process the level N+1 of the wafer.

13. The method of claim 10, further comprising the steps of:
    performing lithography, etching, and metallization at the level N of the wafer to process the level N of the wafer; and
    performing lithography, etching, and metallization at the level N+1 of the wafer to process the level N+1 of the wafer.

14. A method for authentication throughout a process flow for fabrication of chips on a wafer, the method comprising the steps of:
    processing a level N of the wafer during which reference structures are placed across the chips at the level N of the wafer;
    performing first overlay and scatterometry measurements of the reference structures at the level N of the wafer;
    inspecting the level N of the wafer;
    processing a level N+1 of the wafer during which the reference structures are placed across the chips at the level N+1 of the wafer;
    performing second overlay and scatterometry measurements at the level N+1 of the wafer of the reference structures placed at the level N of the wafer; and
    matching the first overlay and scatterometry measurements of the reference structures at the level N of the wafer to the second overlay and scatterometry measurements of the reference structures at the level N of the wafer for authentication of the wafer that has been inspected.

15. The method of claim 14, further comprising the step of:
    performing third overlay and scatterometry measurements of the reference structures at the level N+1 of the wafer.

16. The method of claim 14, further comprising the steps of:
    performing lithography and etching at the level N of the wafer to process the level N of the wafer; and
    performing lithography and etching at the level N+1 of the wafer to process the level N+1 of the wafer.

17. The method of claim 14, further comprising the steps of:
    performing lithography, etching, and metallization at the level N of the wafer to process the level N of the wafer; and
    performing lithography, etching, and metallization at the level N+1 of the wafer to process the level N+1 of the wafer.

18. A wafer, comprising:
chips, fabricated in multiple levels on the wafer, comprising reference structures placed across the chips at each level of fabrication, wherein the reference structures provide a unique fingerprint for authenticating the wafer when at least one of overlay and scatterometry measurements of the reference structures are performed.

19. The wafer of claim 18, wherein the reference structures are selected from the group consisting of: overlay marks, scatterometry macros, and combinations thereof.

20. The wafer of claim 18, wherein the reference structures are placed on at least one of a kerf of the wafer and a chip area of the wafer, and wherein a placement of the reference structures is varied from one level of fabrication to another to avoid overlap of the reference structures.

* * * * *